United States Patent
Keogh et al.

(10) Patent No.: US 8,817,496 B2
(45) Date of Patent: Aug. 26, 2014

(54) PRIMARY-SIDE SENSING ARRANGEMENTS FOR POWER CONVERTERS

(75) Inventors: Bernard Keogh, Cork (IE); Colin Gillmor, Limerick (IE)

(73) Assignee: Texas Instruments (Cork) Limited, Dublin (IE)

( * ) Notice: Subject to any disclaimer, the term of this patent is extended or adjusted under 35 U.S.C. 154(b) by 556 days.

(21) Appl. No.: 13/096,688

(22) Filed: Apr. 28, 2011

(65) Prior Publication Data

US 2011/0286247 A1    Nov. 24, 2011

(30) Foreign Application Priority Data

Apr. 29, 2010   (GB) ................................ 1007144.7

(51) Int. Cl.
 *H02M 3/335*  (2006.01)
 *G01R 19/00*  (2006.01)

(52) U.S. Cl.
 CPC ....... *H02M 3/33523* (2013.01); *G01R 19/0084* (2013.01)
 USPC .................................... 363/21.16; 363/21.12

(58) Field of Classification Search
 USPC .............. 363/20, 21.01, 21.08, 21.12, 21.16
 See application file for complete search history.

(56) References Cited

U.S. PATENT DOCUMENTS

| | | | | |
|---|---|---|---|---|
| 5,438,499 | A  * | 8/1995 | Bonte et al. | 363/21.16 |
| 5,517,397 | A  * | 5/1996 | Quek et al. | 363/21.16 |
| 7,768,802 | B2 * | 8/2010 | Lee et al. | 363/21.16 |
| 8,279,638 | B2 * | 10/2012 | Hsu | 363/21.16 |
| 8,416,596 | B2 * | 4/2013 | Huang | 363/97 |
| 2004/0120165 | A1 * | 6/2004 | Tobita | 363/21.01 |
| 2004/0257839 | A1  | 12/2004 | Yang et al. | |
| 2005/0099828 | A1 * | 5/2005 | Cheng et al. | 363/21.16 |
| 2007/0188155 | A1 * | 8/2007 | Oki et al. | 323/280 |
| 2008/0247199 | A1 * | 10/2008 | Djenguerian et al. | 363/50 |
| 2009/0073725 | A1 * | 3/2009 | Lin | 363/19 |
| 2010/0008109 | A1 * | 1/2010 | Morota | 363/21.16 |
| 2010/0027300 | A1 * | 2/2010 | Fang | 363/21.16 |
| 2010/0085780 | A1 * | 4/2010 | Nakai | 363/21.16 |
| 2010/0110734 | A1 * | 5/2010 | Park | 363/21.16 |

FOREIGN PATENT DOCUMENTS

WO    WO2009010802    1/2009

OTHER PUBLICATIONS

PCT Search Report mailed Aug. 3, 2011.

* cited by examiner

*Primary Examiner* — Adolf Berhane
*Assistant Examiner* — Fred E Finch, III
(74) *Attorney, Agent, or Firm* — William B. Kempler; Frederick J. Telecky, Jr.

(57) ABSTRACT

A sensing arrangement and method a sense winding is used to provide a voltage which represents the voltage appearing across an in-circuit magnetic component. In a flyback phase, when the component is supplying the output, that voltage represents an output voltage and in a supply phase, the supply voltage. This arrangement provides a solution to the problem of the disparity in magnitude of sense winding output during the two phases by proving a pull-up resistor arranged to apply bias to the voltage measured, the pull-up being to a first level during the supply period and to a second value during the flyback period, the first and second levels being selected such that the voltage across the sense winding is scaled differently during the supply period and the flyback period. The invention is suitable for use in a transformer based flyback power converter in which the magnitude disparity problem may be exacerbated by a turns ratio.

20 Claims, 4 Drawing Sheets

PRIMARY-SIDE SENSING ARRANGEMENTS FOR POWER CONVERTERS

CROSS-REFERENCE TO RELATED APPLICATIONS

This patent application claims priority from Great Britain Provisional Patent Application No. 1007144.7, filed Apr. 29, 2010, which is incorporated herein by reference in its entirety.

FIELD OF THE INVENTION

This invention relates to the sensing of a variable in an electrical circuit by means of a sense winding interacting with a magnetic component in the circuit.

BACKGROUND OF THE INVENTION

In such a circuit the magnetic component may be storing energy supplied from the circuit or, when supply to the component is removed, itself supplying previously stored energy to the circuit. During the supply phase, when the component is driven, the voltage output of the sense winding is determined by the supplied drive and the sense winding may be used to measure that drive. During the so-called flyback phase, when stored energy is returned to the circuit, the magnetising current in the component will fall as the energy transfer occurs. The rate at which this occurs depends upon the circuit loading and so, during this time, the output of sense winding may be used to measure circuit behaviour.

In many applications, these sensed voltages will be used to control or regulate a system of which the magnetic component forms part. An advantage of the sensing arrangement is that both voltages may be sensed, albeit at different times, by means of a single connection. Where the controller comprises an integrated circuit device, this means a single connecting pin to the device, which is an important cost saving consideration. However, there are some complications to be addressed in the implementation of such a system in practice.

By the nature of flyback, the voltages to be measured will be of opposite polarity. Moreover, it is likely that the magnitude of the voltage to be measured during the flyback phase will be significantly less than that of the voltage to be measured during the drive phase. Where the magnetic component is a transformer driven on a primary side and producing an output on a secondary side, this situation may be exacerbated since the flyback phase voltage may be divided by the turns ratio of the transformer. Thus there can be significant disparity in the dynamic range of the two measurements. This dynamic range issue detracts from the inherent advantage of single pin sensing and separate sensing arrangements may be required for comparable accuracy in the two measurements. This problem becomes particularly severe and potentially unworkable where a control integrated circuit device operates at a low single ended supply voltage with the sensed voltage biased to give single polarity measurements. Here the poor resolution to which the output voltage (5V, for example, perhaps stepped down by 10:1) can be sensed once the full potential range of the input (90-260 V, for example) is accommodated may be unacceptably low.

One field in which use of a magnetic sense winding is attractive is in power converters. Power converter designs are often based on magnetic coupling between a primary drive circuit fed from a mains derived unregulated dc supply and a secondary output circuit which supplies the load because of the electrical isolation between the primary side and the secondary side. The attraction of the sense winding is that it allows the output on the secondary side to be sensed (for example for the purpose of regulation) without compromising isolation. Indeed, sense windings are already commonly used in power converters, especially for output over-voltage detection. Such a winding is almost always needed for bias generation within the converter in any event.

Unfortunately, the difficulties in using a single sense winding during both drive and flyback that follow from the dynamic range disparity are ruling its use out in many applications. The poor resolution to which the output voltage can be sensed may be unacceptably low for successful regulation to be achieved. For this reason, designs which employ separate secondary side sensing schemes that provide a more accurate measurement of output voltage are being used. Such schemes do not have the isolation advantage of the sense winding and signals are typically fed back to the primary side controller through opto-couplers which arrangements add significantly to the cost of the converter.

SUMMARY OF THE INVENTION

The present invention has been made as a result of studying whether such additional components could be eliminated from converter design in favour of a sense winding.

The present invention provides apparatus and method as set forth in the claims and in particular provides a sensing arrangement for a circuit comprising a magnetic component arranged such that the component is driven during a supply period and provides an output during a flyback period when the component is not supplied, the arrangement including:
 a sense winding coupled to the magnetic component;
 an interface network coupled to the sense winding and arranged to provide a circuit node at which a voltage may be measured as indicative of the voltage across the sense winding; and
 a pull-up resistor arranged to apply bias to the voltage measured, characterised in that:
 the pull-up is to a first level during the supply period and to a second value during the flyback period;
 the first and second levels being selected such that the voltage across the sense winding is scaled differently during the supply period and the flyback period.

Preferably the scaling is such that a value measured during the supply period and a value measured during the flyback period are closer together than would have been the case had the pull-up been constant. The arrangement may be adapted to measure the voltage across the sense winding during both the supply period and the flyback period. Control circuitry having a drive output to which the pull-up resistor is connected maybe arranged to drive the drive output to a first level during the supply period and to a second level during the flyback period. Moreover, the pull-up resistor may be isolated from the interface network during one of said periods, preferably by a diode which becomes reverse biased. Advantageously, isolation is provided during said supply period.

The present invention may readily be incorporated into a power converter or a power adapter, including both AC-DC and DC-DC adapters and converters.

In order that features and advantages of the present invention may be further appreciated some embodiments will be described by way of example only and with reference to the accompanying diagrammatic drawings, of which:

BRIEF DESCRIPTION OF DRAWINGS

Further aspects of the invention will appear from the appending claims and from the following detailed description given with reference to the appending drawings.

DETAILED DESCRIPTION OF AN EXAMPLE EMBODIMENT

Figure 1:
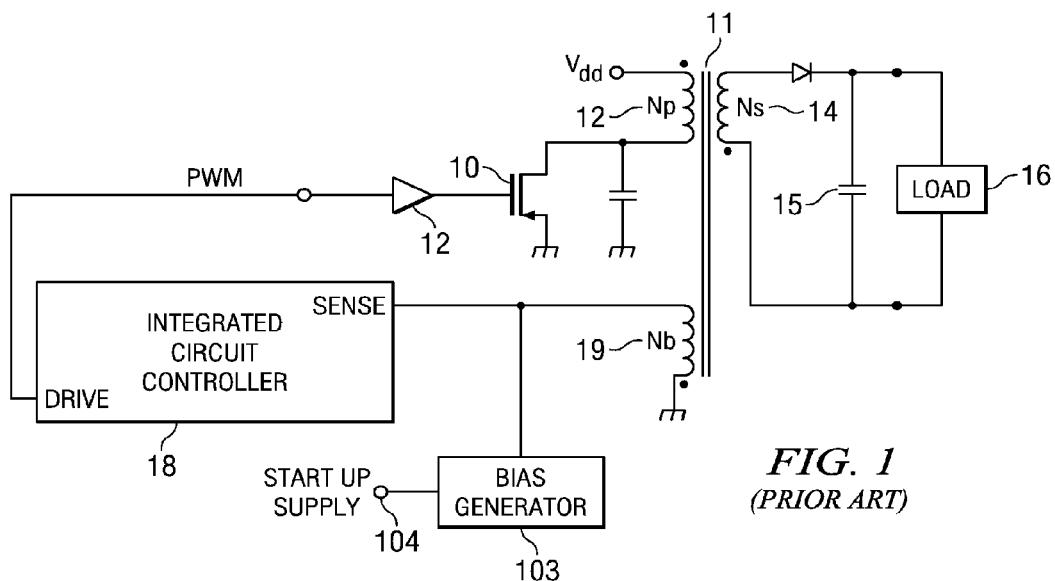
FIG. 1 is an example of a known power converter incorporating a sense winding and a controlling integrated circuit device.

A basic flyback converter set up is shown in FIG. 1 built around a transformer 11 having Np primary turns and Ns secondary turns. When the switch 10 is on, energy is supplied to the transformer by primary winding 12 from the supply at Vdc which causes an increasing magnetising current in the primary. There is no current through secondary winding 14 since diode 15 is reverse biased. The load 16 is supplied from bulk capacitor, having been charged on a previous cycle. When the switch 10 is turned off, the magnetising current transfers to the secondary and the polarity reverses. Diode 15 now conducts and the energy stored in the transformer supplies the load and replenishes the capacitor 15.

It is normally desirable to keep the output voltage of the power converter, i.e. the voltage across the load 16, substantially constant and, as is well known in the art applicable to flyback conversion, such regulation may be achieved by controlling switch 10. A Pulse Width Modulation (PWM) scheme may be used to implement regulation on a cyclical basis wherein, if the output voltage is low during a cycle, the switch 10 is kept closed for a relatively longer time to supply more energy to the transformer for transfer to the output and, if the output voltage is low during a cycle, the switch 10 is kept closed for a relatively shorter time (or even not at all) to supply less energy to the transformer. In a practical realisation, it is likely that the control scheme will be more complex, possibly including changing the PWM frequency in dependence upon load conditions.

Such a scheme is implemented in the arrangement of FIG. 1, wherein a PWM control signal is supplied to switch 10 by a driver circuit 17. The PWM control signal is provided by PWM controller 18 in the form of an integrated circuit, which functions to generate pulse widths that are appropriate to the regulation required. Clearly to achieve this, some feedback of the actual value of the output of the power converter is required and this is derived from a sense winding 19 of Nb turns wound on the core of transformer 11. When the switch 10 if off (flyback phase), the output of the sense winding represents the converter output voltage. As described above, this same winding may also be used to sense the drive voltage Vdc applied to the primary winding when switch 10 is on.

Figure 2:
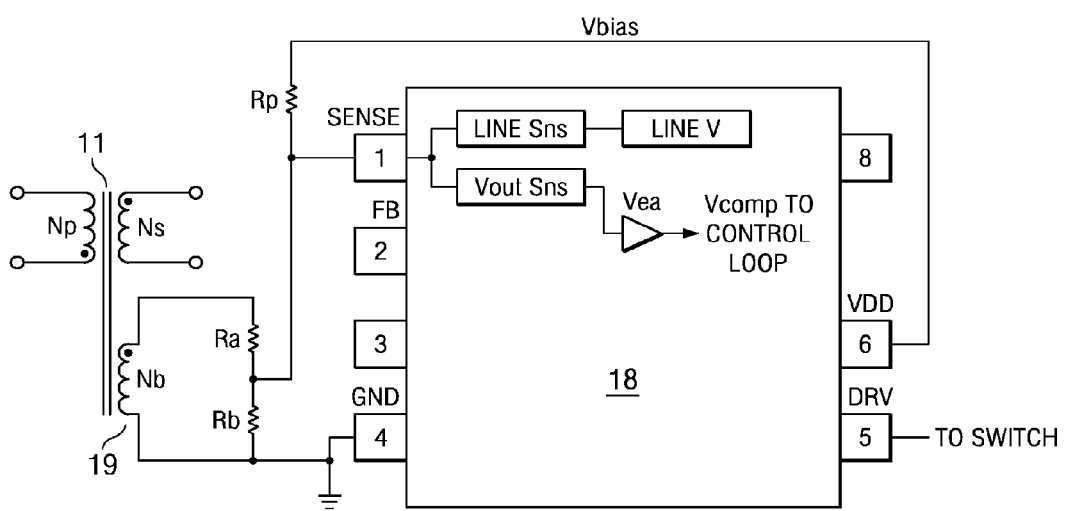
FIG. 2 represents a typical controlling integrated circuit.

In FIG. 2 there is depicted the integrated circuit controller in more detail. In particular, the circuitry which provides an interface to the sense winding 19 is shown. Reference numerals in common with those of FIG. 1 have been used. The integrated circuit controller receives ground and supply (VDD) connections on pins 4 and 6 respectively. Control loop circuitry (not shown) within the device generates a drive signal DRV on pin 5 which controls the switch 10 of FIG. 1.

The voltage across the sense winding 19 is scaled with resistor divider Ra/Rb, and then offset with a pull-up resistor Rp to the bias rail VDD. Typically the positive winding swing is much smaller than the negative swing at high line, all the more so in designs with transformer turns ratios that result in lower reflected voltage on the primary. In some cases, the negative swing could be for example up to 10 times higher than the positive swing. Use of such a dc pull-up offset limits the dynamic range for the positive swing portion of the signal at the SENSE pin (Device pin 1, used to measure the output voltage) to only some 10% of the available range for the pin, limiting performance since 90% for example of the dynamic range is taken up with the negative swing to measure the supply voltage Vdc during the drive phase.

Figure 3:
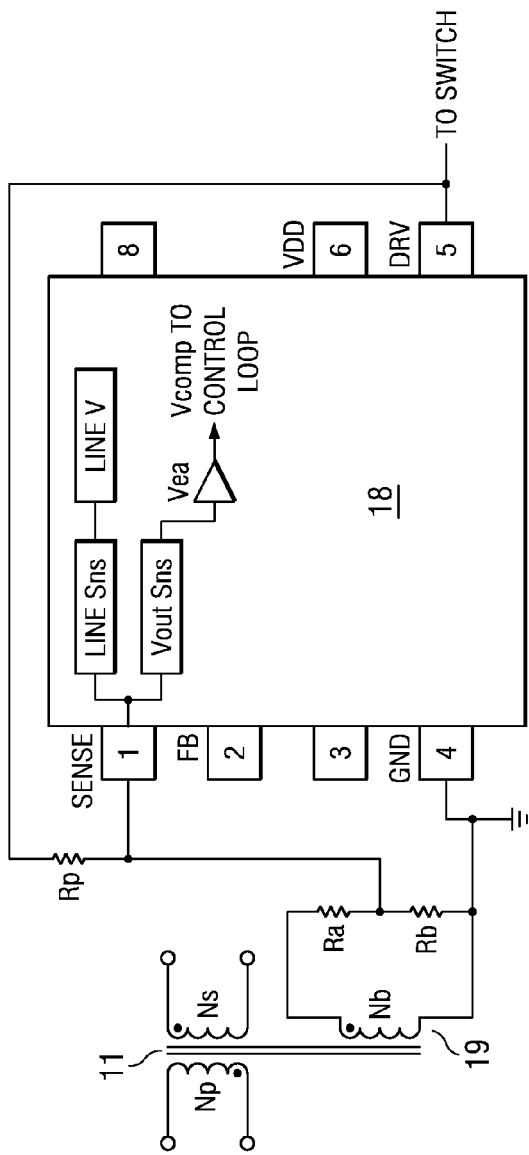
FIG. 3 depicts an embodiment of the present invention.

In accordance with the present invention, an alternative configuration is set out in FIG. 3.

Figure 4:
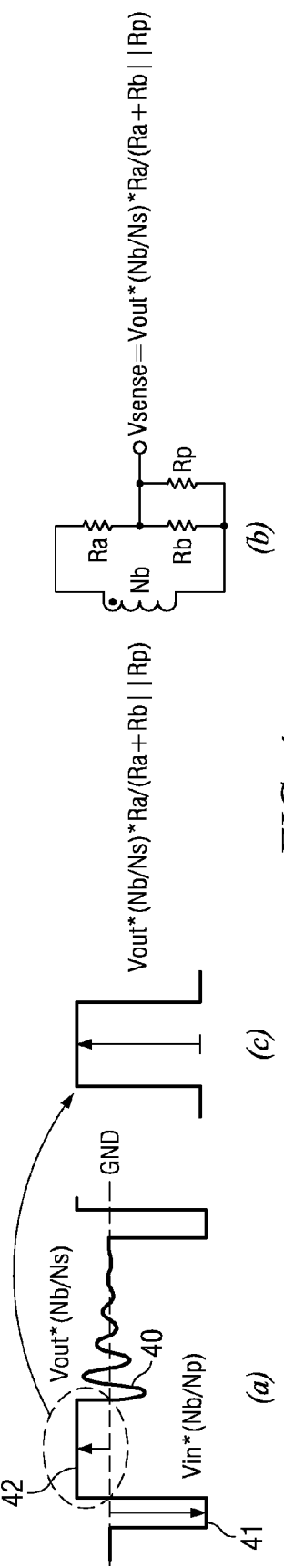
FIG. 4 shows an equivalent circuit for a flyback phase and associated waveforms.
Figure 5:
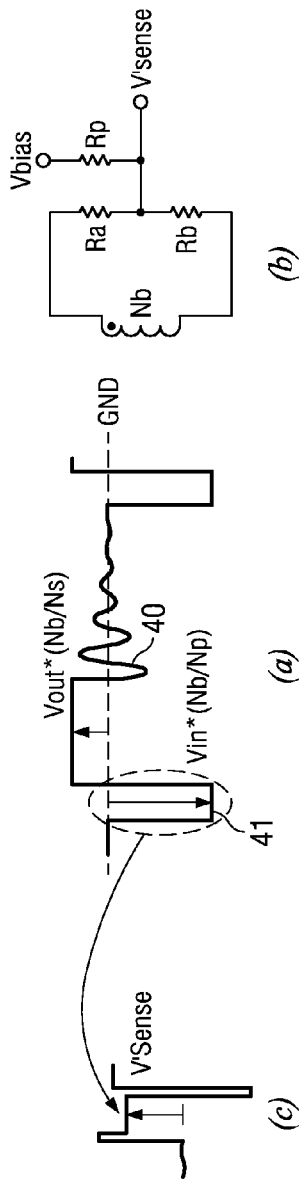
FIG. 5 shows an equivalent circuit for a drive phase and associated waveforms.

In this case the pull-up resistor Rp is not connected to the bias rail, but instead to the controller switch drive pin DRV. The voltage across the winding is scaled with resistor divider Ra/Rb, and then offset with a pull-up resistor Rp to the gate drive pin DRV. When DRV is low, Rp appears in parallel with Rb as shown in FIG. 4(b). This allows the positive voltage swing to be suitably scaled and readily measured at the SENSE pin for output voltage regulation. However, when the DRV pin goes high (typically very close to the Vbias rail value at the VDD pin), this pull-up Rp allows the negative swing on the winding also to be sensed at the SENSE pin, as shown in FIG. 5(b). Thus, the sense winding may be used to sense both supply/line (Line V) input voltage and output voltage (Vout) at improved dynamic range and therefore increased accuracy. The sensed line and output voltages may be used by the integrated circuit controller for input brownout detection, for output voltage regulation in certain regulation modes, and for output over-voltage protection (OVP).

The values for Ra, Rb and Rp may be chosen to allow the sense winding voltage to be suitably scaled to cater for a range of transformer turns ratios. Use of the pull-up Rp connected to DRV permits sensing both the positive and negative swing on the sense winding in a way that each signal may be separately scaled, so that dynamic range of both signals can be maximised. This is illustrated in FIGS. 4(a) and 5(a).

In FIG. 4(a) a trace 40 depicts the output of the sense winding 19. During a period 41 when switch 10 is on, the output, Vb, is given by:

Vb=Vin(Nb/Np), where Vin=the supply voltage, Vdc.

During the flyback phase 42 when switch 10 is off, the sense winding output is given by:

Vb=Vout(Nb/Ns), where Vout is the voltage at the secondary output.

During this latter time, since the DRV pin is low, the interface circuit shown in 4(b) is operative and therefore scales this voltage to Vout (Nb/Ns)Ra/Ra+Rp∥Rb) [FIG. 4(c)] at the SENSE pin and this is the voltage measured and fed to an error amplifier Vea, which in turns controls a PWM loop (not shown).

Similarly, during the drive phase 40, the circuit shown in FIG. 5(b) is operative, scaling the voltage at the SENSE pin (V'sense) [FIG. 5(c)] to:

$$V\text{sense}=V\text{bias}(RaRb/(Ra+Rb))-V\text{in}(Nb/Np)Rp(Rb/(Ra+Rb))(Rp+RaRb/(Ra+Rb))$$

Thus the invention acts to scale the drive phase sense winding voltage and the flyback phase sense winding voltage differently such that they straddle the ground potential more symmetrically than the unscaled values. Thus, measurements may be taken over a smaller dynamic range with improved accuracy.

Figure 6:
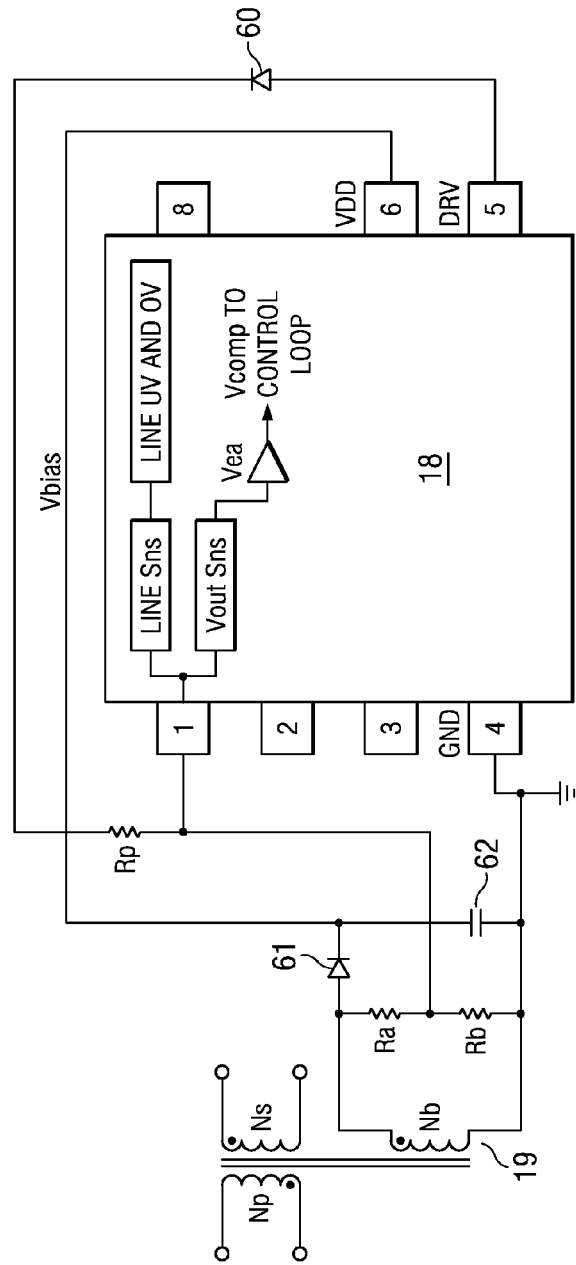
FIG. 6 depicts an alternative embodiment of the present invention.

An alternative embodiment of the present invention will now be described with reference to FIG. 6 and which may offer advantage in certain applications.

Figure 7:
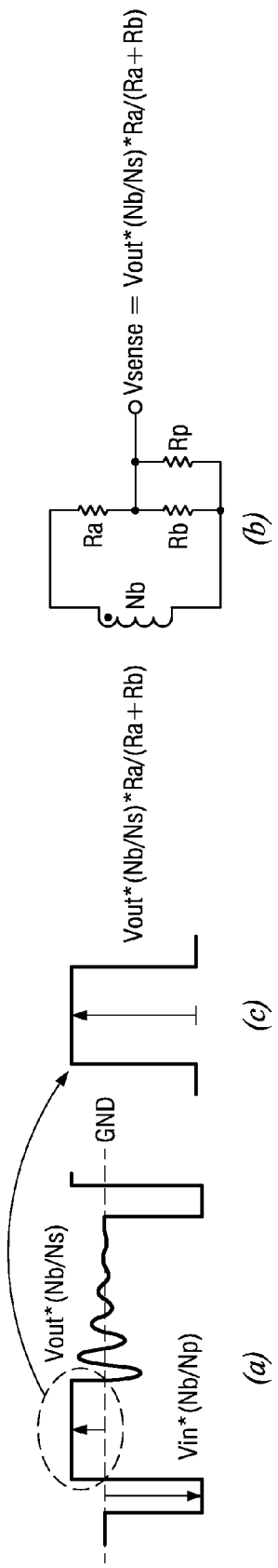
FIG. 7 shows an equivalent circuit for a flyback phase and associated waveforms.
Figure 8:
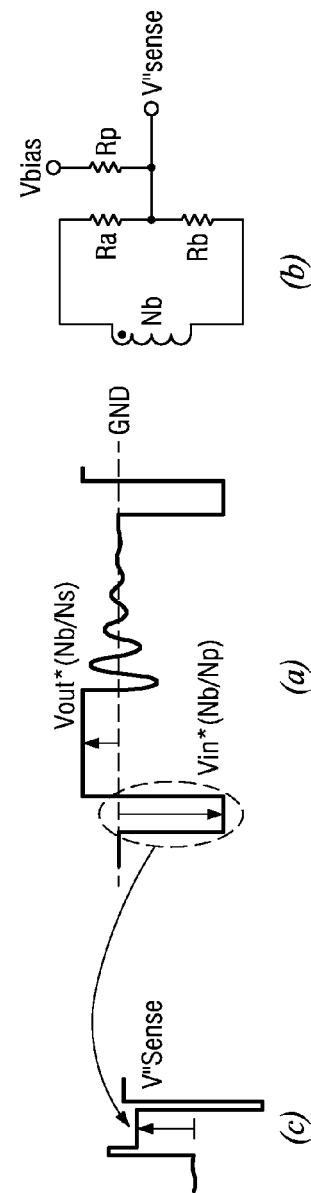
FIG. 8 shows an equivalent circuit for a drive phase and associated waveforms.

In embodiment, a diode 60 connected from the DRV pin to Rp decouples the pull-up when the DRV pin is low. This simplifies the specification and calculation of Ra, Rb & Rp, since during the flyback phase Rp no longer has to be taken into account. For this embodiment, figures equivalent to FIGS. 4 and 5 (which relate to FIG. 3) are presented as FIGS. 7 and 8 respectively.

Diode 60 also decouples the Ra, Rb, Rp network from the DRV pin. This is useful if the DRV pin is used for any other purpose, in, for example, a device test or device set up mode. Also shown in FIG. 6 is a biasing arrangement comprising rectifier 61 and smoothing capacitor 62. Thus, in this embodiment, the supply for the controlling device 18 (VDD) is derived entirely from the sense winding so that in effect the sense winding adds no cost to the bill of materials for the manufacture of such an embodiment. Moreover, when the pull up is isolated it consumes no power.

Although the invention has been described in detail, it should be understood that various changes, substitutions and alterations can be made thereto without departing from the spirit and scope of the invention as defined by the appended claims.

What is claimed is:

1. A sensing arrangement for a circuit comprising a magnetic component arranged such that the component is driven during a supply period and provides an output during a flyback period when the component is not supplied, the arrangement comprising:
    a sense winding coupled to the magnetic component;
    an interface network coupled to the sense winding and arranged to provide a circuit node at which a voltage may be measured as indicative of the voltage across the sense winding; and
    a fixed value pull-up resistor arranged to apply bias to the voltage measured, wherein the fixed value is chosen so that the circuit node is always positive over a range of input voltage;
    the pull-up is to a first level during the supply period and to a second level during the flyback period;
    the first and second levels being selected such that the voltage across the sense winding is scaled differently during the supply period and the flyback period.

2. A sensing arrangement as claimed in claim 1, and wherein the scaling is such that a value measured during the supply period and a value measured during the flyback period are closer together than would have been the case had the pull-up been constant.

3. A sensing arrangement as claimed in claim 1, and adapted to directly measure the voltage across the sense winding during both the supply period and the flyback period.

4. A sensing arrangement as claimed in claim 1, and including control circuitry, the control circuitry having a drive output to which the pull-up resistor is connected and arranged to drive the drive output to the first level during the supply period and to the second level during the flyback period.

5. A sensing arrangement as claimed in claim 4, and wherein a supply for said controller circuit is derived from said sense winding.

6. A sensing arrangement as claimed in claim 4, and wherein said measurements are sensed at a same input pin of said control circuitry.

7. A sensing arrangement as claimed in claim 1, and wherein the pull-up resistor is isolated from the interface network during one of said periods.

8. A sensing arrangement as claimed in claim 7, and wherein said isolation is provided by a diode.

9. A sensing arrangement as claimed in claim 7, and wherein said isolation is provided during said supply period.

10. A power converter embodying the sensing arrangement of claim 1.

11. A power converter as claimed in claim 10, and including a transformer to which the sense winding is coupled, wherein a drive output of a control circuitry drives a primary winding of said transformer.

12. A method of sensing for a circuit comprising a magnetic component arranged such that the component is driven during a supply period and provides an output during a flyback period when the component is not supplied, the arrangement including:
    providing a sense winding coupled to the magnetic component;
    providing an interface network coupled to the sense winding and arranged to provide a circuit node at which a voltage may be measured as indicative of the voltage across the sense winding; and
    providing a fixed value pull-up resistor arranged to apply bias to the voltage measured, wherein the fixed value is chosen so that the circuit node is always positive over a range of input voltage; the
    pulling-up to a first level during the supply period and to a second value during the flyback period; and
    selecting the first and second levels such that the voltage across the sense winding is scaled differently during the supply period and the flyback period.

13. A method as claimed in claim 12, and wherein the scaling is such that a value measured during the supply period and a value measured during the flyback period are closer together than would have been the case had the pulling-up been constant.

14. A method as claimed in claim 12, and including the steps of measuring the voltage across the sense winding during both the supply period and the flyback period.

15. A method as claimed in claim 12, and including providing control circuitry, the control circuitry having a drive output to which the pull-up resistor is connected and arranged to drive the drive output to a first level during the supply period and to a second level during the flyback period.

16. A method as claimed in claim 15, and including deriving a supply for said controller circuitry from said sense winding.

17. A method as claimed in claim 15, and including sensing said measurements at a same input pin of said control circuitry.

18. A method as claimed in claim 12, and including isolating the pull-up resistor from the interface network during one of said periods.

19. A method as claimed in claim 18, and including isolating the pull-up resistor from the interface network by means of a diode.

20. A method as claimed in claim 18, and including isolating the pull-up resistor from the interface network during said supply period.

* * * * *